United States Patent
Juang et al.

(10) Patent No.: US 9,157,024 B2
(45) Date of Patent: Oct. 13, 2015

(54) PHOSPHOR AND LIGHT EMITTING DEVICE

(71) Applicant: Chi Mei Corporation, Tainan (TW)

(72) Inventors: Yuan-Ren Juang, Tainan (TW); Jen-Shrong Uen, Tainan (TW)

(73) Assignee: CHI MEI CORPORATION, Tainan (TW)

( * ) Notice: Subject to any disclaimer, the term of this patent is extended or adjusted under 35 U.S.C. 154(b) by 119 days.

(21) Appl. No.: 14/034,587

(22) Filed: Sep. 24, 2013

(65) Prior Publication Data

US 2014/0175970 A1 Jun. 26, 2014

(30) Foreign Application Priority Data

Dec. 22, 2012 (TW) .............................. 101149356 A

(51) Int. Cl.
| | | |
|---|---|---|
| *C09K 11/59* | (2006.01) | |
| *C09K 11/77* | (2006.01) | |
| *C09K 11/08* | (2006.01) | |
| *H01L 33/50* | (2010.01) | |

(52) U.S. Cl.
CPC .......... *C09K 11/7728* (2013.01); *C09K 11/0883* (2013.01); *H01L 33/502* (2013.01); *H01L 2224/48091* (2013.01); *H01L 2224/48247* (2013.01); *H01L 2224/8592* (2013.01)

(58) Field of Classification Search
CPC ........... C09K 11/0883; C09K 11/7734; H01L 33/502
See application file for complete search history.

(56) References Cited

U.S. PATENT DOCUMENTS

| | | | |
|---|---|---|---|
| 6,924,592 B2 | 8/2005 | Urabe | |
| 7,258,816 B2 * | 8/2007 | Tamaki et al. | .......... 252/301.4 F |
| 7,671,529 B2 | 3/2010 | Mueller et al. | |
| 8,663,500 B2 | 3/2014 | Emoto et al. | |
| 8,686,631 B2 | 4/2014 | Hanamoto et al. | |
| 2006/0124947 A1 | 6/2006 | Mueller et al. | |
| 2009/0243467 A1 | 10/2009 | Shimizu et al. | |
| 2009/0284948 A1 | 11/2009 | Yamao et al. | |
| 2010/0176713 A1 | 7/2010 | Hanamoto et al. | |
| 2011/0163322 A1 | 7/2011 | Yoo et al. | |
| 2013/0200425 A1 | 8/2013 | Kashiwagi et al. | |

FOREIGN PATENT DOCUMENTS

| | | |
|---|---|---|
| CN | 1818012 A | 8/2006 |
| TW | 200419826 A | 10/2004 |
| WO | 2012073177 A1 | 6/2012 |

OTHER PUBLICATIONS

Schlieper and Schlick: Nitridosilicate I, Hochtemperatursynthese und Kristallstruktur von Ca 2 Si 5 N 8 , Z. anorg. allg. Chem. 621, (1995), p. 1037.
Schlieper, Millus and Schlick: Nitridosilicate II, Hochtemperatursynthesen und Kristallstrukturen von Sr 2 Si 5 N 8 and Ba 2 Si 5 N 8 , Z. anorg. allg. Chem. 621, (1995),p. 1380.
Non-Final Office Action issued in U.S. Appl. No. 14/077,285, filed Nov. 12, 2013, mailed Sep. 17, 2014.
JP Office Action dated Jan. 13, 2015.

* cited by examiner

*Primary Examiner* — Carol M Koslow

(74) *Attorney, Agent, or Firm* — McClure, Qualey & Rodack, LLP

(57) ABSTRACT

A phosphor and a light emitting device are provided. The phosphor comprises a composition having a formula of $A_a Si_5 O_t N_n:Eu_z$. A is selected from the group consisting of Be, Mg, Ca, Sr and Ba. $1.7 < a < 2.5$. $0 \leq t < 1$, $7 < n < 9$. $0.001 < z < 0.3$. The phosphor has Mo of 10 ppm-500 ppm.

12 Claims, 1 Drawing Sheet

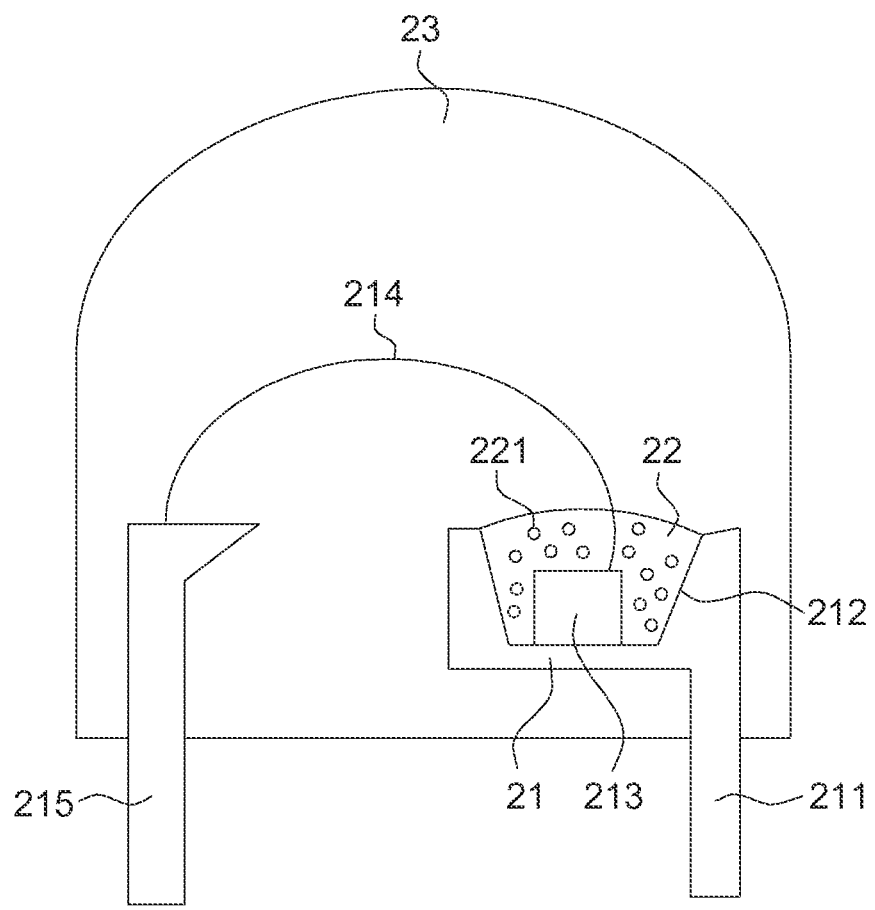

PHOSPHOR AND LIGHT EMITTING DEVICE

This application claims the benefit of Taiwan application Serial No. 101149356, filed Dec. 22, 2012, the subject matter of which is incorporated herein by reference.

BACKGROUND OF THE INVENTION

1. Field of the Invention

The invention relates in general to a phosphor and a light emitting device comprising the same, and particularly a phosphor comprising a composition formula of $A_aSi_5O_tN_n:Eu_Z$ and a light emitting device comprising the same.

2. Description of the Related Art

In recent years, a light emitting device utilizing a semiconductor for emitting light has been intensively used. In particular, a light emitting diode (LED) has been developed successfully. Compared to a conventional light emitting equipment, such as a cold cathode fluorescent lamp and an incandescent lamp, the light emitting device utilizing the light emitting diode has advantages of higher emitting efficiency, smaller volumes, lower power consumption, and lower cost. Therefore, such light emitting device is used as various light sources. A semiconductor light emitting device comprises a semiconductor light emitting element and a phosphor. The phosphor can absorb and convert light emitted from the semiconductor light emitting element. The light emitted directly from the semiconductor light emitting element and light converted and emitted from the phosphor can be mixed for use. The light emitting device can be used in various applications, such as a fluorescent light, a car lighting, a display device, and a backlight for a liquid crystal display. A white light emitting device is used extensively. The current white light emitting device is formed by using YAG phosphor ($Y_3Al_5O_{12}$:Ce) having the element cerium as an active center with a semiconductor light emitting element for emitting a blue light. However, the chromaticity coordinates of the mixed lights from the $Y_3Al_5O_{12}$:Ce phosphor and the blue-light semiconductor light emitting element is on a junction line between the chromaticity coordinates of the blue-light semiconductor light emitting element and the $Y_3Al_5O_{12}$:Ce phosphor. Therefore, the emitted mixed light is a white light lacking a red light, and is insufficient for color rendering property and color saturation property. In addition, the $Y_3Al_5O_{12}$:Ce phosphor has a major excitation spectrum area inconsistent with the light emitting region of the semiconductor light emitting element, thus the phosphor generates poor conversion efficiency of the excited light. It is not easy to obtain a white light source for high brightness. For solving the problem of poor color hue and low brightness, it is developed to mix the YAG:Ce phosphor with a phosphor for emitting a red light, and improve quality of the red light phosphor, for increasing luminous brightness.

However, a phosphor absorbing a blue light and converting it into a red light is rare. The materials of development researches are focused on nitride and oxynitride phosphors. The known phosphors comprise $Sr_2Si_5N_8$:Eu using the element Eu as the active center, $CaAlSiN_3$:Eu, and sialon phosphor having a formula of $M_zSi_{12-(m+n)}Al_{m+n}O_nN_{16-n}$:Eu. However, luminous brightness of the $Sr_2Si_5N_8$:Eu phosphor is poor, and thus an application of the phosphor is limited and not wide. The sialon phosphor has adequate durability, but luminous brightness of which is poor, thus the phosphor is not popular. The $CaAlSiN_3$:Eu phosphor has better durability, and, compared to the sialon phosphor, has better brightness, however, there is still a demand for further increasing the luminous brightness for the phosphor for a light emitting device exhibiting higher light emitting efficiency.

SUMMARY OF THE INVENTION

The present invention provides a phosphor material exhibiting high luminous brightness, and a light emitting device formed by using the phosphor material and a semiconductor light emitting element, also exhibiting high luminous brightness.

According to one embodiment, a phosphor is provided. The phosphor comprises a composition comprising a composition formula of $A_aSi_5O_tN_n:Eu_Z$. A is selected from the group consisting of Be, Mg, Ca, Sr and Ba. $1.7<a<2.5$. $0\le t<1$. $7<n<9$. $0.001<z<0.3$. The phosphor has 10 ppm-500 ppm of Mo.

According to another embodiment, a light emitting device is provided. The light emitting device comprises a semiconductor light emitting element and the said phosphor. The phosphor is excited by an exciting light emitted from the semiconductor light emitting element and converts the exciting light into and to emit an emitting light having a wavelength different from a wavelength of the exciting light.

BRIEF DESCRIPTION OF THE DRAWINGS

FIG. 1 is a perspective view of a light emitting device according to one embodiment.

DETAILED DESCRIPTION OF THE INVENTION

In embodiments, a phosphor comprises a composition having a formula of $A_aSi_5O_tN_n:Eu_Z$, and the phosphor has element Mo. Compared to a phosphor without element Mo, the phosphor having element Mo has a higher luminous brightness value in the same chromaticity. The same chromaticity means a difference between chromaticity coordinates x,y is within ±0.002.

In embodiments, A is selected from the group consisting of Be, Mg, Ca, Sr and Ba. Preferably, A is selected from the group consisting of Ca, Sr and Ba. $1.7<a<2.5$. Preferably, $1.8<a<2.3$. $0\le t<1$. Preferably, $0\le t<0.5$. $7<n<9$. Preferably, $7<n<8$.

The phosphor for emitting a light of high brightness is obtained by controlling a Mo element content of the phosphor to be within a specific range, since the Mo element content affects the brightness. The phosphor of the invention has element Mo of 10 ppm-500 ppm, and a phosphor having a Mo element content beyond the range would have a reduced brightness. In embodiments, the phosphor has Mo of 20 ppm-350 ppm preferably, and 25 ppm-200 ppm more preferably.

In embodiments, the phosphor satisfies a condition of $0.001<z<0.3$. Much less Eu content of an illumination center of the phosphor would result in a decreased brightness of an emitting light from the phosphor. Much more Eu content of the illumination center of the phosphor would result in a decreased brightness of an emitting light from the phosphor due to interference between Eu atoms. In embodiments, the phosphor satisfying a condition of $0.01<z<0.05$ can generate an emitting light having a preferable brightness.

When the phosphor is excited by a light having a wavelength of 455 nm, an emitting light from the excited phosphor has a main wavelength of 580 nm-680 nm and CIE 1931 chromaticity coordinates (x,y) of $0.45\le x\le 0.72$ and $0.2\le y\le 0.5$. The main wavelength of an emitting light means a wavelength corresponding to the maximum luminous intensity in a luminescence spectrum.

In embodiment, for manufacturing the phosphor, a raw material for element Si may comprise a nitrogen containing compound, an oxygen containing compound, a compound having any suitable formula, or Si of element form. For example, a mixture of silicon containing nitride/oxide ($Si_3N_4$/$SiO_x$) may be used. The oxygen containing compound may comprise an oxide, a carbonate, an oxalate, or other suitable compounds. The nitrogen containing compound indicates a compound containing both elements Si and N.

The element Mo may be added to reach the content range of the invention as an additive for sintering preferably. A precursor for the element Mo is not limited, and may be a Mo metal, a molybdenum carbonate, a molybdenum nitride, a molybdenum oxide, a molybdenum hydroxide, a molybdenum hydride, etc. In embodiments, the molybdenum oxide is preferable, such as molybdenum trioxide, molybdenum dioxide, etc., wherein molybdenum trioxide is preferable.

In embodiments, raw materials for the phosphor may be various different forms of precursors. For convenience, some embodiments using a nitride and an oxide are disclosed. An oxide or a nitride of the element A and the element Si may be merchant raw materials. Since a raw material with a higher degree of purity has better property, it is preferable to prepare the raw material of higher than 3N (99.9%). Preferably, a particle size of each of the raw materials is designed to be micro size based on a viewpoint of promoting reaction. A particle size and a shape of the phosphor would be changed according to particle sizes and shapes of raw materials. Therefore, the nitride, oxide raw materials having particle sizes similar with that of the desired phosphor can be prepared. The raw material for the element Eu can be a merchant oxide, nitride, or metal, with high degree of purity, preferably higher than 2N (99%), and more preferably higher than 3N (99.9%).

The raw materials may be mixed by a dry method (such as a ball grinding in a dry condition) or a wet method (such as a ball grinding in a condition with a liquid), etc, not limiting to a single method. Since raw materials $Ca_3N_2$, $Sr_3N_2$, $Si_3N_4$, $Ba_3N_2$ are compounds that would be oxidized easily, they should be handled in a glove box with an inactive condition properly. In addition, it is better to use a dehydrated gas as an inactive gas filling the glove box since each of the nitrides of the raw materials would be influenced by water easily. In addition, a proper organic solvent may be used for the wet method for the mixing, and pure water which would result in decomposition from the raw materials should be avoided. A mixer device may use a ball mill, a mortar, or other common devices.

In a method for manufacturing the phosphor, the raw materials may be weighed to be a specific ratio, then put in a crucible, and then sintered with the crucible in a high temperature furnace. The high temperature furnace for the sintering can use a metal resistive heating type or a graphite resistive heating type preferably since a sintering temperature is high. The sintering method may be performed under an ambient atmospheric pressure or a condition compressed by gas, or other conditions without an external mechanical pressure. The crucible has a material of high degree of purity, that is, having an impurity of extreme small amount, such as a $Al_2O_3$ crucible, a $Si_3N_4$ crucible, a AlN crucible, a Sialon crucible, a boron nitride (BN) crucible, or other crucibles suitable for using in the inactive environment, in which the BN crucible is preferably since it can provide a good effect preventing an impurity of which from mixing into the raw materials. A sintering ambiance may uses non-oxidizing gas, such as nitrogen gas, hydrogen gas, ammonia gas, argon gas, etc, or a combination thereof. A sintering temperature is 1200° C.-2200° C., preferably 1400° C.-2000° C. A heating rate is 3° C./min-15° C./min. The phosphor can be manufactured as having a smaller particle size by using a lower sintering temperature, or having a larger particle size by using a higher sintering temperature. A sintering time may be controlled according to types of the raw materials, usually 1-12 hours preferably. A sintering pressure of the inactive environment may be, for example, equal to or lower than 0.5 MPa, particularly equal to or lower than 0.1 MPa preferably. After the sintering step, the phosphor may be further cooled to a room temperature, pulverized by using the ball mill or a pulverizer, etc., and then rinsed by water, filtered, dried, and classified, etc.

For obtaining the phosphor having high brightness, the phosphor composition should have the impurity content as little as possible. The impurities may come from factors of adding a fluxing agent in the sintering step, impurities of the raw materials, a contamination during the treatment processes, etc. The high impurity content, particularly the element fluorine, the element boron, the element chlorine, the element carbon, etc, would inhibit light emitting. Therefore, the raw materials should be selected as having high degree of purity, and the synthesize step should be prevented from being contaminated, for decreasing each of the element fluorine, the element boron, the element chlorine, the element carbon, etc, to be lower than 1000 ppm.

As the phosphor of the present invention is used as powder, an average particle size (referring to volumetric mean particle size (D50)) in the present invention) of which is equal to or smaller than 30 µm preferably. The reason is that an illumination of phosphor powders mainly occurs on surfaces of the particles, and if the average particle size is equal to or smaller than 30 µm, the surface area per unit weight of phosphor powders will be assured, thus the decrease of brightness is avoided. Besides, when the phosphor powders are coated on the light emitting element, the density of the phosphor powders can be increased. From this viewpoint, the decrease of brightness can also be avoided. In addition, based on the viewpoint of the illumination efficiency of phosphor powders, it is preferable that the average particle size is equal to or larger than 1 µm. According to the above-mentioned, the average particle size of the phosphor of the invention is preferably 1 µm-30 µm, and in particular preferably 3.0 µm-20 µm. The so-called average particle size (D50) here is measured with Multisizer-3 by Beckman Coulter, Inc. utilizing Coulter counter method.

The phosphor of the present invention is applicable to vacuum fluorescent displays (VFD), field emission displays (FED), plasma display panels (PDP), cathode ray tubes (CRT), light emitting diodes, and etc. Particularly, when the phosphor is excited by a light having a wavelength of 455 nm, an emitting light from the excited phosphor has a main wavelength of 580 nm-680 nm and CIE 1931 chromaticity coordinates (x,y) of $0.45 \leq x \leq 0.72$ and $0.2 \leq y \leq 0.5$, and has high brightness, thus the phosphor is suitable for the light emitting diodes.

The light emitting device of the invention comprises a semiconductor light emitting element and the phosphor of the invention. Preferably, the semiconductor light emitting element can emit a light having a wavelength of 300 nm-550 nm. Particularly the semiconductor light emitting element may be a ultraviolet (or violet) semiconductor light emitting element for emitting a ultraviolet (or violet) light having a wavelength of 330-420 nm, or a blue semiconductor light emitting element for emitting a blue light having a wavelength of 420-500 nm. The semiconductor light emitting element may be zinc sulfide or gallium nitride, or other suitable semiconductor materials, in which the gallium nitride is preferable for illumination efficiency. The gallium nitride may be formed on a substrate by a metal-organic chemical vapor deposition (MOCVD) method, a hydride vapor phase epitaxy (HVPE) method, etc. The light emitting element formed from $In_\alpha Al_\beta Ga_{1-\alpha-\beta}N$ ($0\leq\alpha$, $0\leq\beta$, $\alpha+\beta<1$) is preferable. The semiconductor structure may use MIS junction, PIN junction, PN junction of homo junction structure, hetero junction structure or double hetero junction structure, etc. The wavelength of the emitting light may be controlled by adjusting materials or crystal mix degree of the semiconductor layer.

The phosphor of the invention can either be used singly or by cooperating with other phosphors of other light emitting characteristics, to obtain the light emitting device capable of emitting a light of desired color. For example, the ultraviolet light emitting element of 330 nm-420 nm, and a blue phosphor (such as $BaMgAl_{10}O_{17}$:Eu) for emitting light of 420 nm-500 nm after being excited by the ultraviolet light emitting element, a green phosphor (such as β-sialon phosphor) for emitting light of 500 nm-570 nm after being excited by the ultraviolet light emitting element, and the phosphor to the invention, are assembled to manufacture the light emitting device. Red light, green light, and blue light will be emitted respectively when the phosphors are illuminated by the ultraviolet light emitted from the light emitting element, and the lights will be mixed to become a white light for the light emitting device.

In addition, for example, a blue light emitting element of 420 nm-500 nm, a yellow phosphor (such as $Y_3Al_5O_{12}$:Ce) for emitting light of 550 nm-600 nm after being excited by the blue light emitting element, and the phosphor of the invention, are assembled to manufacture the light emitting device. Red light and yellow light will be emitted respectively when the phosphors are illuminated by the blue light emitted from the light emitting element, and the two red and yellow lights will be mixed with the blue light to become a white light for the light emitting device such as a light apparatus or a light bulb.

In addition, for example, the blue light emitting element of 420 nm-500 nm, the green phosphor (such as β-sialon phosphor) for emitting light of 500 nm-570 nm after being excited by the blue light emitting element, and the phosphor of the invention, are assembled to manufacture the light emitting device. Red light and green light will be emitted respectively when the phosphors are illuminated by the blue light emitted from the light emitting element, and the two red and green lights will be mixed with the blue light to become a white light for the light emitting device such as a light apparatus.

Embodiment and Comparative Example

The present invention is illustrated with the following embodiments, but is not limited thereto.

Measurement Methods:

(1) Brightness and chromaticity coordinates of phosphor(s): The brightness of the phosphor and the chromaticity coordinates were measured with a TOPCON brightness meter (SR-3A) set to emit light with wavelengthsof 455 nm. Measurement inaccuracy in measurement value is within ±0.3%.

(2) Main wavelength of light from phosphor: The main wavelength was measured by Fluoro Max-3 of Jobin YVON. The main wavelength means a wavelength corresponding to the maximum luminous intensity in a luminescence spectrum of the phosphor excited by light of phosphor.

(3) Composition Analysis of Phosphor(s):

(3-1a) Instrument: The measurement was carried out with inductively coupled plasma atomic emission spectrometer (ICP) (ULTIMA-2 type, Jobin Yvon Technology).

(3-1b) Pretreatments of sample(s): A sample of 0.1 gram was accurately weighed and taken to place in a platinum crucible. 1 gram of $Na_2CO_3$ was added into the platinum crucible, and mixed with the sample uniformly. Then, the mixture was fused by a high temperature furnace in 1200° C. (temperature condition: temperature was raised from the room temperature to 1200° C. in 2 hours and stayed at 1200° C. for 5 hours). The fusion product was then cooled and added into an acid solution, such as 25 ml HCl (36%), and then heated to be dissolved until the solution was clear. The solution was then placed into a 100 mL PFA volumetric flask after being cooled and quantitatively added with pure water to the marked line of the flask.

(3-2a) Instrument: Nitrogen and Oxygen analyzer (Horiba Ltd., EMGA-620W).

(3-2b) Measurement: 20 mg of the phosphor was placed into a Sn capsule, and then the capsule was placed in a crucible to be measured.

SYNTHESIS EXAMPLE 1

Ca metal (3N7, 99.97%), Sr metal (3N7, 99.97%), and Ba metal (2N, 99%) were pulverized and then sintered in a pure nitrogen ambience by 750° C., 700° C., and 700° C., respectively, for 24 hours to form $Ca_3N_2$, $Sr_3N_2$, and $Ba_3N_2$.

Embodiment 1 through Embodiment 5 and Comparative example 1 through Comparative Example 3

The phosphors of embodiments 1-5 and comparative examples 1-3 were synthesized by similar methods except a difference in usage amount of $MoO_3$. The Synthesis method for the phosphor of embodiment 3 is illustrated as the following.

In embodiment 3, 204.648 g of $Sr_3N_2$ of synthesis example 1, 250.000 g of $Si_3N_4$ (3N), 4.892 g of $Eu_2O_3$ (4N), 0.046 g of $MoO_3$ (2N) were weighed and mixed by using a mortar in a glove box under a nitrogen environment to form a raw material for the phosphor. $MoO_3$ occupied 0.003 wt. % of the raw material for the phosphor (shown in column of Mo wt. % in table 1).

Then, the raw material for the phosphor was placed in a sintering container made of boron nitride, followed by placing the sintering container with the raw material therein in a high temperature furnace with highly pure nitrogen atmosphere. The gas flow rate of the nitrogen was set at 80 liter/min. The temperature was raised to 1800° C. at the heating rate of 10° C./min and maintained at 1800° C. for 8 hours, and the operating pressure of the high temperature furnace was maintained at 0.1 MPa to proceed the sintering. After the sintering, the temperature was cooled to the room temperature with the cooling rate of 10° C./min. The steps of pulverizing, ball milling, washing with water twice, filtering, drying, and sorting, etc., were performed to the sintered mixture to obtain the phosphor.

Analysis results of the nitrogen and oxygen analyzer and ICP of embodiment 3 show that the phosphor has a composition formula of $Sr_{1.926}Si_5O_{0.108}N_{7.416}$:$Eu_{0.021}$, namely $A_aSi_5O_tN_n$:$Eu_Z$ in where A is Sr, a=1.926, t=0.108, n=7.416, z=0.021. In addition, the phosphor has 87 ppm of Mo.

Embodiment 6

The phosphors of embodiment 6 and embodiment 3 were synthesized by similar methods except a difference in using $MoO_2$ in embodiment 6 replacing $MoO_3$ in embodiment 3.

MoO$_2$ occupied 0.010 wt. % of the raw material for the phosphor (shown in column of Mo wt. % in table 1).

Embodiment 7

The phosphors of embodiment 7 and embodiment 3 were synthesized by similar methods except a difference in the raw material for the phosphor in embodiment 7 was prepared by the following: 90.846 g of Sr$_3$N$_2$ of synthesis example 1, 137.423 g of Ba$_3$N$_2$ of synthesis example 1, 224.000 g of Si$_3$N$_4$ (3N), 7.418 g of Eu$_2$O$_3$ (4N), and 0.046 g of MoO$_3$ (2N) were weighed and mixed by using a mortar in a glove box under a nitrogen environment to form the raw material for the phosphor. MoO$_3$ occupied 0.010 wt. % of the raw material for the phosphor (shown in column of Mo wt. % in table 1).

Embodiment 8

The phosphors of embodiment 8 and embodiment 3 were synthesized by similar methods except a difference in the raw material for the phosphor in embodiment 8 was prepared by the following: 5.326 g of Ca$_3$N$_2$ of synthesis example 1, 193.954 g of Sr$_3$N$_2$ of synthesis example 1, 252.000 g of Si$_3$N$_4$ (3N), 8.345 g of Eu$_2$O$_3$ (4N), and 0.046 g of MoO$_3$ (2N) were weighed and mixed by using a mortar in a glove box under a nitrogen environment to form the raw material for the phosphor.

Table 1 lists the source compounds for the element Mo and weight percentage of which occupying in the raw material for the phosphors in embodiments and comparative examples. Table 1 also lists the properties of the phosphors, comprising the element A, the Mo content (in ppm), and the brightness in the chromaticity coordinates x, y. The main wavelength of an emitting light from the phosphor means a wavelength corresponding to the maximum luminous intensity in the luminescence spectrum.

TABLE 1

|  | Mo (ppm) | brightness | x | y |
|---|---|---|---|---|
| Comparative example 1 | 0 | 121 | 0.627 | 0.371 |
| Embodiment 1 | 10 | 126 | 0.626 | 0.372 |
| Embodiment 2 | 28 | 128 | 0.625 | 0.373 |
| Embodiment 3 | 87 | 134 | 0.624 | 0.374 |
| Embodiment 4 | 147 | 130 | 0.624 | 0.374 |
| Embodiment 5 | 410 | 127 | 0.623 | 0.375 |
| Comparative example 2 | 541 | 120 | 0.622 | 0.376 |
| Embodiment 6 | 100 | 124 | 0.628 | 0.370 |
| Embodiment 7 | 92 | 131 | 0.625 | 0.373 |
| Embodiment 8 | 80 | 127 | 0.627 | 0.371 |

|  | Element A | Mo source | Mo (wt. %) | Main wavelength (nm) |
|---|---|---|---|---|
| Comparative example 1 | Sr | None | 0 | 618 |
| Embodiment 1 | Sr | MoO$_3$ | 0.003 | 618 |
| Embodiment 2 | Sr | MoO$_3$ | 0.005 | 618 |
| Embodiment 3 | Sr | MoO$_3$ | 0.010 | 617 |
| Embodiment 4 | Sr | MoO$_3$ | 0.030 | 617 |
| Embodiment 5 | Sr | MoO$_3$ | 0.080 | 617 |
| Comparative example 2 | Sr | MoO$_3$ | 0.100 | 617 |
| Embodiment 6 | Sr | MoO$_2$ | 0.010 | 619 |
| Embodiment 7 | Sr, Ba | MoO$_3$ | 0.010 | 618 |
| Embodiment 8 | Sr, Ca | MoO$_3$ | 0.010 | 618 |

According to table 1, under the same chromaticity, the brightness of embodiments 1, 2, 6-8 is higher than that of comparative example 1. Under the same chromaticity, the brightness of embodiments 3-5 is higher than that of comparative example 2.

The light emitting device may be formed by packaging the phosphor according to embodiments and the semiconductor light emitting element.

Referring to FIG. 1, in embodiments, the light emitting device comprises a semiconductor light emitting element 21, a phosphor layer 22 and packaging layer 23.

The semiconductor light emitting element 21 comprises a conductive base 211 having a concave bearing surface 212, a light emitting diode chip 213 disposed in the concave bearing surface 212 and electrically connected to the base 211, a connecting wire 214 electrically connected to the light emitting diode chip 213, a conducting wire 215 electrically connected to the connecting wire 214. The base 211 and the conducting wire 215 can supply external electrical energy to the light emitting diode chip 213. The light emitting diode chip 213 can convert the electrical energy to light energy and emit it out. In one embodiment, the light emitting diode chip 213 of commercial available InGaN (Chi Mei Lighting Technology Corp.) of light emitting wavelength of 455 nm is adhered on the concave bearing surface 212 of the base 211 with a conductive silver paste (BQ6886, Uninwell International), and then the connecting wire 214 electrically connected to the light emitting diode chip 213 and the conducting wire 215 are connected to extend from the top surface of the light emitting diode chip 213.

The phosphor layer 22 covers the light emitting diode chip 213. After the phosphors 221 contained in the phosphor layer 22 are excited by the light emitted from the light emitting diode chip 213, the phosphors 221 converts the light emitted from the light emitting diode chip 213 into and to emit an emitting light different from the exciting light in wavelength. In the example, the phosphor layer 22 is formed by coating a polysiloxane resin containing 35wt. % of the phosphors 221 on the external surface of the light emitting diode chip 213 followed by a drying and curing step.

The packaging layer 23 covers a part of the base 211 of the light emitting element 21, the connecting wire 214, a part of the conducting wire 215, and the phosphor layer 22.

Accordingly, in embodiments, the phosphor has characteristic of high brightness. Thus, as the phosphor is incorporated with the semiconductor light emitting element, the light emitting device having characteristic of high brightness can be obtained.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A phosphor, wherein the phosphor comprises a composition having a formula of A$_a$Si$_5$O$_t$N$_n$:Eu$_z$, A is selected from the group consisting of Be, Mg, Ca, Sr and Ba, 1.7<a<2.5, 0≤t<1, 7<n<9, 0.001<z<0.3, the phosphor has Mo of 10 ppm-92 ppm.

2. The phosphor according to claim 1, wherein the phosphor has Mo of 20 ppm-87 ppm.

3. The phosphor according to claim 1, wherein the phosphor has Mo of 25 ppm-28 ppm.

4. The phosphor according to claim 1, wherein 1.8<a<2.3, 0≤t<0.5, 7<n<8, 0.01<z<0.05.

5. The phosphor according to claim 1, wherein A is selected from the group consisting of Ca, Sr and Ba.

6. The phosphor according to claim 1, wherein when the phosphor is excited by an exciting light having a wavelength of 455 nm, CIE 1931 chromaticity coordinates (x,y) of an emitting light from the phosphor is 0.45≤x≤0.72, 0.2≤y≤0.5.

7. A light emitting device, comprising:
a semiconductor light emitting element; and
the phosphor according to claim 1, wherein the phosphor is excited by an exciting light emitted from the semiconductor light emitting element and converts the exciting light to emit an emitting light having a wavelength different from a wavelength of the exciting light.

8. The light emitting device according to claim 7, wherein the phosphor is according to claim 2.

9. The light emitting device according to claim 7, wherein the phosphor is according to claim 3.

10. The light emitting device according to claim 7, wherein the phosphor is according to claim 4.

11. The light emitting device according to claim 7, wherein the phosphor is according to claim 5.

12. The light emitting device according to claim 7, wherein when the phosphor is according to claim 6.

* * * * *